(12) United States Patent
Han et al.

(10) Patent No.: US 8,493,540 B2
(45) Date of Patent: Jul. 23, 2013

(54) DISPLAY PANEL AND METHOD OF MANUFACTURING THE SAME

(75) Inventors: Kyoung-Tai Han, Suwon-si (KR); Jang-Soo Kim, Yongin-si (KR); Byung-Duk Yang, Yongin-si (KR)

(73) Assignee: Samsung Display Co., Ltd. (KR)

( * ) Notice: Subject to any disclaimer, the term of this patent is extended or adjusted under 35 U.S.C. 154(b) by 434 days.

(21) Appl. No.: 12/335,095

(22) Filed: Dec. 15, 2008

(65) Prior Publication Data

US 2010/0149464 A1    Jun. 17, 2010

(51) Int. Cl.
*G02F 1/1339* (2006.01)

(52) U.S. Cl.
USPC ............................. 349/155; 349/106; 349/144

(58) Field of Classification Search
USPC .......................................... 349/106, 144, 155
See application file for complete search history.

(56) References Cited

U.S. PATENT DOCUMENTS

| | | | | |
|---|---|---|---|---|
| 6,038,006 A * | 3/2000 | Sasaki et al. | | 349/106 |
| 6,118,505 A * | 9/2000 | Nagata et al. | | 349/106 |
| 6,287,733 B1 * | 9/2001 | Miyazaki et al. | | 430/7 |
| 6,693,697 B2 * | 2/2004 | Sakamoto et al. | | 349/138 |
| 6,922,183 B2 * | 7/2005 | Ting et al. | | 345/87 |
| 6,927,814 B2 * | 8/2005 | Lee et al. | | 349/106 |
| 2001/0019373 A1 * | 9/2001 | Kobayashi et al. | | 349/39 |
| 2005/0179853 A1 * | 8/2005 | Chen et al. | | 349/155 |
| 2005/0286003 A1 * | 12/2005 | Lee et al. | | 349/141 |
| 2006/0012741 A1 * | 1/2006 | Mizusako | | 349/130 |
| 2007/0229735 A1 * | 10/2007 | Lee et al. | | 349/106 |
| 2008/0291370 A1 * | 11/2008 | Kurosawa et al. | | 349/96 |

FOREIGN PATENT DOCUMENTS

| | | |
|---|---|---|
| JP | 09-096806 | 8/1997 |
| JP | 2000-162643 | 6/2000 |
| JP | 2001-147434 | 5/2001 |
| JP | 2006-301505 | 11/2006 |
| KR | 10-2003-0058214 | 7/2003 |
| KR | 10-2007-0037115 | 4/2007 |

\* cited by examiner

*Primary Examiner* — Lucy Chien
(74) *Attorney, Agent, or Firm* — Cantor Colburn LLP

(57) ABSTRACT

A display panel comprises a first substrate, a second substrate including a display area and a peripheral area surrounding the display area, a transistor layer including, formed in the display area of the substrate, at least one transistor connected to a gate line and a data line, at least one color filter formed in a plurality of pixel regions on the transistor layer, a light blocking member disposed between the color filters, at least one pixel electrode formed on the color filter, an opaque spacing part formed on the color filter corresponding to the transistor so as to maintain a cell gap between the first and second substrates. The light blocking member in some embodiments of the invention is not formed on the first and second transistors to allow for inspection of a channel in the transistor.

22 Claims, 8 Drawing Sheets

DISPLAY PANEL AND METHOD OF MANUFACTURING THE SAME

BACKGROUND OF THE INVENTION

1. Technical Field

The present invention relates to a display panel and a method of manufacturing the display panel, and more particularly, to a display panel comprising an opaque spacing part in a pixel area and a method of manufacturing the display panel.

2. Discussion of the Related Art

A liquid crystal display (LCD) device which is a type of flat panel display includes an array substrate, an opposing substrate facing the array substrate and a liquid crystal layer interposed between the array substrate and the opposing substrate.

Color-filter On Array (COA) technology for forming a color filter on the array substrate is used to enhance transmittance of the LCD device.

In order to employ the COA technology on the array substrate, a thin film transistor (TFT) layer including a TFT is formed on a substrate. A color photo-resist layer is formed on the TFT layer, and a color filter is formed in a pixel area by patterning the color photo-resist layer. Then, a pixel electrode is formed and is electrically connected to the TFT that is formed in the pixel area where the color filter is formed so that a COA substrate is formed. The opposing substrate facing the COA substrate where the color filter is formed includes a common electrode facing the pixel electrode and a light blocking member.

When the COA substrate is combined with the opposing substrate where the light blocking member is formed, miss-alignment may occur. Therefore, a Black matrix On Array (BOA) Technology for forming the light blocking member on the COA substrate has developed to prevent the miss-alignment.

However, under the BOA Technology, since the light blocking members are generally formed on a data line, a gate line and the TFT to prevent light leakage and photo current, a channel between a source electrode and a drain electrode of the TFT is invisible.

Therefore, it is difficult to detect a defect in the channel and repair the channel.

SUMMARY OF THE INVENTION

Exemplary embodiments of the present invention provide an array substrate having an enhanced display quality and a method of manufacturing the same.

According to an exemplary embodiment of the present invention, a display panel comprises a first substrate, a second substrate including a display area and a peripheral area surrounding the display area. A transistor layer is formed in the display area of the substrate, and at least one of transistors is connected to a gate line and a data line. At least one color filter is formed in a plurality of pixel regions on the transistor layer. A light blocking member is disposed between the color filters, and at least one of the pixel electrodes is formed on the color filter. An opaque spacing part is formed on the color filter corresponding to the transistor so as to maintain a cell gap between the first and second substrates.

The color filter is thinner than the light blocking member. A passivation layer including organic or inorganic material is formed on the color filter and the light blocking layer. The pixel electrode comprises a first sub-pixel electrode and a second sub-pixel electrode separated from each other. At least one of the first sub-pixels and the second sub-pixels has micro slits of which the width is below 2.5 times of the cell gap. The light blocking member is not formed on the transistor.

According to another exemplary embodiment of the present invention, a method of manufacturing an array substrate includes forming a substrate including a display area and a peripheral area surrounding the display area, forming a transistor layer including at least one of transistor connected to a gate line and a data line and a circuit layer including a metal pattern in the peripheral area, forming at least one color filter on the transistor layer, forming a light blocking member disposed between the color filters, forming at least one pixel electrode on the color filter, and forming an opaque spacing part on the color filter corresponding to the transistor so as to maintain a cell gap.

A passivation layer is formed on the color filter and the light blocking layer. The color filter is formed by an inkjet method after the light blocking member is formed, and the color filter is thinner than the light blocking member. The light blocking member is not formed on the transistor. The defect of the transistors is inspected and repaired after the pixel electrode is formed.

The pixel electrode comprises a first sub-pixel electrode and a second sub-pixel electrode separated from each other, and at least one of the first sub-pixel and the second sub-pixel has micro slits of which the width is below 2.5 times of the cell gap.

BRIEF DESCRIPTION OF THE DRAWINGS

Exemplary embodiments of the present invention can be understood in more detail from the following descriptions taken in conjunction with the accompanying drawings, in which.

DESCRIPTION OF THE EXEMPLARY EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein.

Figure 1A:
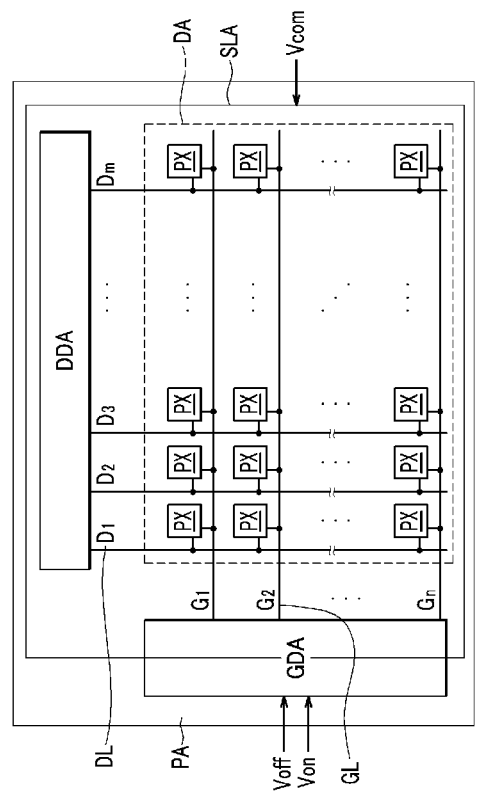
FIG. 1A is a plan view of an array substrate according to an exemplary embodiment of the present invention.
Figure 1B:
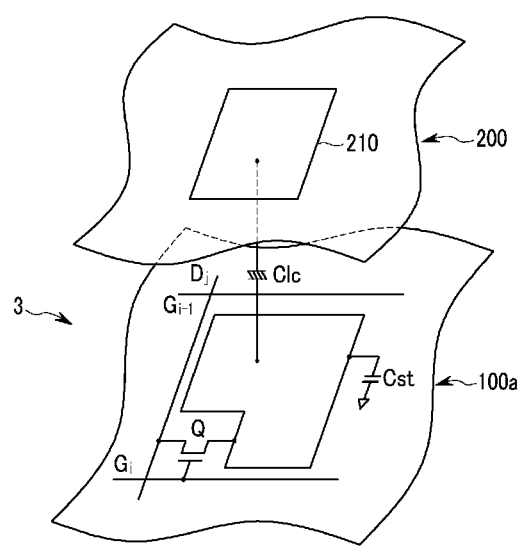
FIG. 1B is a perspective view schematically showing a display panel according to an exemplary embodiment of the present invention.

FIG. 1A is a plan view of an array substrate according to an exemplary embodiment of the present invention. FIG. 1B is a perspective view schematically showing a display panel according to an exemplary embodiment of the present invention.

Referring to FIGS. 1A and 1B, a display panel includes an array substrate 100a, an opposite substrate 200 facing the array substrate 100a and a liquid crystal layer (not shown) interposed between the array substrate 100a and the opposite substrate 200.

The array substrate 100a includes a display area (DA) and a peripheral area (PA) surrounding the display area DA. A plurality of gate lines (GL) and a plurality of data lines (DL) crossing the gate lines are formed in the display area DA. A plurality of pixel electrodes is formed in the display area DA.

The peripheral area PA includes a data driving area (DDA), a gate driving area (GDA) and a seal line area (SLA).

The data driving area DDA includes input pads receiving driving signals of the display panel and output pads outputting data signals to the data lines.

The gate driving area GDA includes a gate driving circuit generating a gate signal that is applied to the gate lines.

The seal line area SLA includes a sealant to combine the array substrate 100a with the opposite substrate 200. In an exemplary embodiment, the seal line area SLA is overlapped with the gate driving area GDA.

Since the sealant is disposed between the gate driving circuit and a common electrode formed on the opposite substrate 200, capacitance generated by the gate driving circuit and the common electrode can be reduced.

Figure 2:
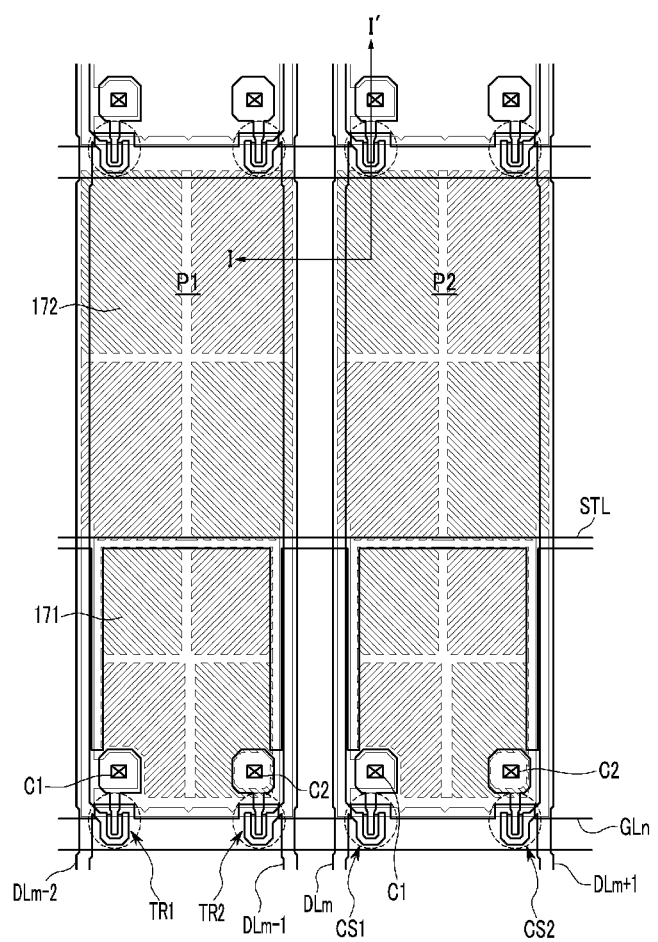
FIG. 2 is an enlarged plan view of an array substrate of FIG. 1A.
Figure 3:
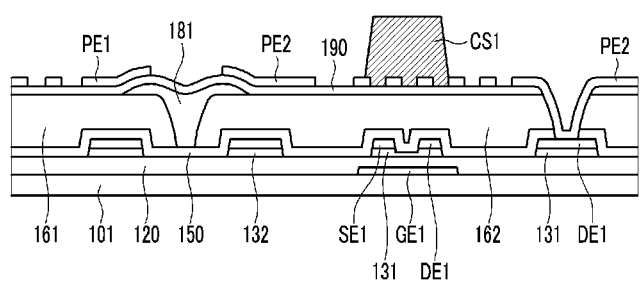
FIG. 3 is a cross-sectional view taken along a line I-I' of FIG. 2.

FIG. 2 is an enlarged plan view of an array substrate of FIG. 1A. FIG. 3 is a cross-sectional view taken along a line I-I' of FIG. 2.

Referring to FIGS. 1A to 3, the display panel includes the array substrate 100a, the opposite substrate 200 and a liquid crystal layer 300. The opposite substrate 200 includes a common electrode 210.

The array substrate 100a includes a base substrate 101. The base substrate 101 includes the display area DA and the peripheral area PA surrounding the display area DA.

The display area DA includes a transistor layer, a first color filter 161 and a second color filter 162, a light blocking member 181, pixel electrodes PE1 and PE2 and a spacing part CS1.

The transistor layer includes a gate metal pattern formed on the base substrate 101, a gate insulation layer 120, semiconductor layer patterns 131 and 132, a source metal pattern and a first passivation layer 150. The gate metal pattern includes a plurality of gate lines GLn, gate electrodes GE1 and GE2 and a storage line STL. The n-th gate line GLn is extended in a first direction. The n-th gate line GLn includes the first gate electrode GE1 of a first transistor TR1 and the second gate electrode GE2 (not shown in the figures) of a second transistor TR2.

The storage line STL is formed in parallel with the n-th gate line GLn.

The gate insulation layer 120 is formed on the gate metal pattern. The semiconductor patterns 131 and 132 are formed to correspond to the source metal pattern.

In an exemplary embodiment, the first semiconductor pattern 131 is formed on the first and second gate electrodes GE1 and GE2 corresponding to a first source and drain electrodes SE1 and DE1, a second source and drain electrodes SE2 and DE2 (not shown in the figures) respectively, and the second semiconductor pattern 132 is formed corresponding to the data lines DLm−1, DLm, DLm+1 and DLm+2. The semiconductor patterns 131 and 132 include an active layer, an ohmic contact layer and a channel between the source electrode and the drain electrode to form the transistor.

The source metal pattern includes a plurality of data lines DLm−1, DLm, DLm+1 and DLm+2, the first and second source electrodes SE1 and SE2 and the first and second drain electrodes DE1 and DE2. The data lines DLm−1, DLm, DLm+1 and DLm+2 are formed in a second direction that crosses the first direction. The first and second source electrodes SE1 and SE2 are repeatedly extended from the data lines DLm−1, DLm, DLm+1 and DLm+2. The first and second source electrodes SE1 and SE2 are overlapped with the first and second gate electrodes GE1 and GE2.

The first and second drain electrodes DE1 and DE2 are spaced apart from the first and second source electrode SE1 and SE2 respectively and are overlapped with the first and second gate electrodes GE1 and GE2 respectively. The first and second drain electrodes DE1 and DE2 are connected to the first and second sub-pixel electrodes 171 and 172 through a first contact hole C1 and a second contact hole C2, respectively.

The first passivation layer 150 is formed on the base substrate 101 where the source metal pattern is formed. The first passivation layer 150 protects the exposed semiconductor pattern 131 and the source metal patterns of the first and second transistors TR1, TR2.

The first and second color filters 161 and 162 are formed in the pixel areas of the base substrate 101 where the transistor layer is formed. The first color filter 161 includes a first color, and the second color filter 162 includes a second color that is different from the first color. A boundary area of the first and second color filters 161 and 162 includes a first opening area to expose the first passivation layer 150. In an exemplary embodiment, portions of the color filters 161, 162 that are formed between the m-th data line DLm and the m+1-th data line DLm+1 are removed so that the first opening area is formed. The color filters 161, 162 may further include second opening areas that correspond to the first and second contact holes C1 and C2 respectively.

The light blocking member 181 is formed in the first and second contact holes C1 and C2 and on the data lines DLm−1, DLm, DLm+1 and DLm+2 and the gate lines GLn, however, the light blocking member 181 is not formed on the first and second transistors TR1 and TR2. The light blocking member 181 divides the pixel areas where the color filters 161, 162 are formed. The light blocking member 181 includes a material that can prevent light leakage.

A second passivation layer 190 which includes an organic material or an inorganic material may be formed on the color filters 161 and 162 and the light blocking member 181, and be removed in the opening areas.

Each of the pixel electrodes PE1 and PE2 formed in the pixel areas P1 and P2 includes a first sub-pixel electrode 171 and a second sub-pixel electrode 172 electrically separated from each other to be provided with a different gray voltage respectively and improve visibility of the display panel. Also, the first and second sub-pixel electrodes 171 and 172 have a plurality of micro slits which are extended in a direction in parallel with tilting the liquid crystal layer and therefore form different domains. The width of the micro slits is below 2.5 times of a cell gap, which defines the distance between the substrates, in order to speed up the movement of the liquid crystal molecules.

Furthermore, the domains in the first and second sub-pixel electrodes 171 and 172 can be formed by chevron patterns, e.g. openings or protrusions (not shown in Figs.).

The first sub-electrode 171 is electrically connected to the drain electrode DE1 of the first transistor TR1 through the first contact hole C1. The second sub-electrode 172 is electrically connected to the drain electrode DE2 of the second transistor TR2 through the second contact hole C2.

The storage line STL is overlapped with the first sub-pixel electrode 171 and the second sub-pixel electrode 172 to form a storage capacitor between the sub-pixel electrodes and the storage line.

In another exemplary embodiment, the storage line STL may not be overlapped with the first and second sub-pixel electrodes 171 and 172 so that the storage line STL can prevent cross-talk between the first sub electrode 171 and the second sub electrode 172.

The spacing part CS1 is formed on the color filter 162 and the transistor layer, especially the first and second transistor TR1 and TR2. The spacing part CS1 can be disposed in an area corresponding to the gate metal pattern or the source metal pattern. The spacing part CS1 maintains the cell gap between the array substrate 100a and the opposite substrate 200.

The spacing part CS1 includes an opaque material which can be organic or inorganic to prevent the first and second transistor TR1 and TR2 from generating the photo current.

FIGS. 4A to 4D are cross-sectional views showing a method of manufacturing a display panel of FIG. 3.

Figure 4A:
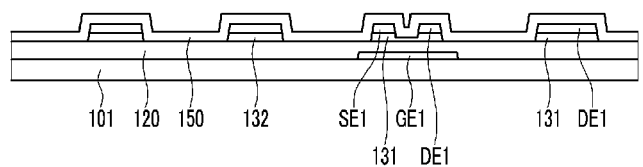
FIGS. 4A to 4D are cross-sectional views showing a method of manufacturing an array substrate of FIG. 3.

Referring to FIGS. 2, 3 and 4A, the display area DA of the base substrate 101 includes the transistor layer, and the peripheral area PA of the base substrate 101 includes the circuit layer.

In an exemplary embodiment, a gate metal layer is formed on the base substrate 101. The gate metal pattern is formed by patterning the gate metal layer. The gate metal pattern includes the n-th gate line GLn, the gate electrodes GE1, GE2, the storage line STL and the metal pattern of the peripheral area PA. The gate insulation layer 120 is formed on the base substrate 101 where the gate metal pattern is formed.

A semiconductor layer and a source metal layer are sequentially formed on the base substrate 101 where the gate insulation layer 120 is formed. The first and second semiconductor patterns 131 and 132 are patterned to form the active layer, the ohmic contact layer and the channel on the gate insulation layer 120.

The source metal pattern is patterned to form the data lines DLm−1 and DLm, the source electrodes SE1 and SE2 and the drain electrodes DE1 and DE2. The source electrodes SE1, SE2 and the drain electrodes DE1, DE2 are formed on the first semiconductor pattern 131. The data lines DLm−1 and DLm are formed on the second semiconductor pattern 132. The source metal pattern may further include a metal pattern for the gate driving circuit and the electrostatic prevention circuit in the peripheral area PA.

Therefore, the first transistor TR1 and the second transistor TR2 are formed with the first and second gate electrodes GE1 and GE2, the first semiconductor pattern 131, the first and second source electrodes SE1 and SE2, the first and second drain electrodes DE1 and DE2 respectively.

Meanwhile, it is preferable for the semiconductor layer and the source metal layer to be simultaneously patterned to reduce manufacturing process steps.

The first passivation layer 150 is formed on the base substrate 101 where the source metal pattern is formed.

Figure 4B:
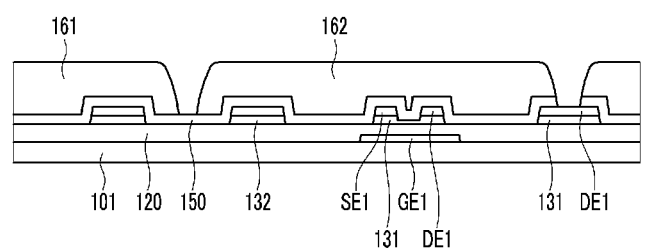

Referring to FIGS. 2, 3, and 4B, by a photo lithography method, the first color filter 161 and the second color filter 162 are sequentially formed on the base substrate 101 where the transistor layer and the circuit layer CL are formed.

In an exemplary embodiment, the first color filter 161 including the first color is formed in the first pixel area P1. The second color filter 162 including the second color is formed in the second pixel area P2.

Figure 4C:
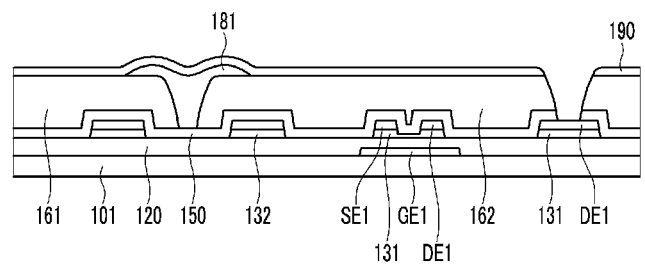

Referring to FIGS. 2, 3, and 4C, a light blocking layer is formed on the display area DA and the peripheral area PA of the base substrate 101 where the first color filter 161 and the second color filter 162 are formed. The light blocking member 181 is formed in the first opening area of the display area DA by patterning the light blocking layer. Meanwhile, in some embodiments of the invention the light blocking member 181 is not to be formed on the first and second transistors TR1 and TR2 to inspect a channel between the source electrodes and the drain electrodes.

The second insulating layer 190 may be formed on the color filters 161 and 162, and the light blocking member 181.

The first and second color filters 161 and 162, the first passivation layer 150 and the second passivation layer 190 may be simultaneously patterned to expose the first and second drain electrodes DE1 and DE2 corresponding to the first and second contact holes C1 and C2 respectively and therefore form the second opening area.

Figure 4D:
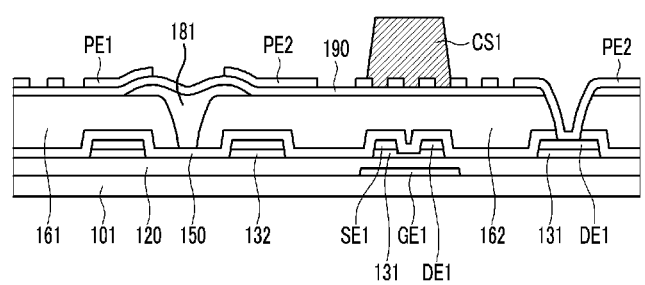

Referring to FIGS. 2, 3 and 4D, a transparent conductive layer is formed on the color filters 161 and 162, the light blocking member 181, the second passivation layer 190 and the first and second contact holes C1 and C2. The transparent conductive layer is patterned so that the pixel electrodes PE1 and PE2 are formed in the pixel areas P1 and P2 of the display area DA respectively. The first and second sub-pixel electrodes 171 and 172 of the pixel electrodes PE1 and PE2 are connected to the drain electrodes DE1 and DE2 in the second opening area respectively.

Meanwhile, after the transparent conductive layer is patterned, a process of inspecting and repairing the defect of the first and second transistors TR1 and TR2 is accomplished by applying a voltage to the array substrate.

An opaque layer is formed on the base substrate 101 where the color filters 161 and 162, the light blocking member 181 and the pixel electrodes DE1 and DE2 are located. The spacing part CS1 is formed in an area corresponding to the gate metal pattern or the source metal pattern by patterning the opaque layer. To prevent the transistors from generating a photo current, the spacing part CS1 is disposed on the first and second transistor TR1 and TR2. The spacing part CS1 includes an opaque material which may be organic or inorganic.

Figure 5:
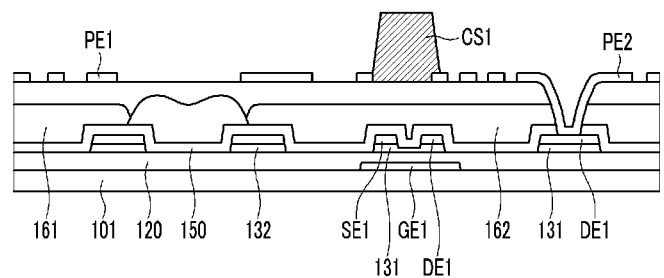
FIG. 5 is a cross-sectional view illustrating an array substrate according to another exemplary embodiment of the present invention.

FIG. 5 is a cross-sectional view illustrating an array substrate according to another exemplary embodiment of the present invention.

The layered structure of the display panel illustrated in FIGS. 2 and 5 is substantially the same as that of a display panel illustrated in FIGS. 2 and 3.

Referring to FIGS. 2 and 5, the display panel includes the array substrate 100a, the opposite substrate 200 and the liquid crystal layer 300.

The array substrate 100a includes the base substrate 101 having the display area DA and the peripheral area PA.

The display area DA includes the transistor layer, the first and second color filters 161 and 162, the first light blocking member 181, the pixel electrodes PE1 and PE2 and the spacing part CS1. The peripheral area PA includes the circuit layer.

A detailed explanation on the transistor layer according to another exemplary embodiment of the present invention will be omitted since the structure of the transistor layer illustrated in FIG. 5 is the same as that of the transistor layer illustrated in FIG. 2.

The light blocking member 181 is formed between the data lines DLm−1, DLm, DLm+1 and DLm+2 and the gate lines GLn. The light blocking member 181 divides the pixel areas defined by crossing the data lines DLm−1, DLm, DLm+1 and DLm+2 and the gate lines GLn. In some embodiments of the invention the first and second transistors TR1 and TR2 are not covered by the light blocking member 181. The light blocking member 181 includes a material that can prevent light leakage.

The first and second color filters 161 and 162 are formed within the light blocking member 181, especially in the pixel areas of the base substrate 101 where the transistor layer is formed. In some embodiments of the invention the color filters 161 and 162 are thinner than the light blocking member 181 so as to prevent the color filters 161 and 162 from mingling with each other. The first color filter 161 includes a first color, and the second color filter 162 includes a second color that is different from the first color. The color filters 161, 162 may include opening areas that correspond to the first and second contact holes C1 and C2 respectively.

A second passivation layer 190 which includes an organic material or an inorganic material may be formed on the color filters 161 and 162 and the light blocking member 181, and be removed in the opening areas. In some embodiments of the invention the second passivation layer 190 has an even surface so as to prevent light leakage in a boundary area between the color filters 161, 162 and light blocking member 181.

Each of the pixel electrodes PE1 and PE2 formed in the pixel areas P1 and P2 includes a first sub-pixel electrode 171 and a second sub-pixel electrode 172 electrically separated from each other to be provided with a different gray voltage respectively and improve visibility of the display panel. Also, the first and second sub-pixel electrodes 171 and 172 have a plurality of micro slits which are extended in a direction in parallel with tilting the liquid crystal layer and therefore form different domains. The width of the micro slits is below 2.5 times the cell gap, which defines the distance between the substrates, in order to speed up the movement of the liquid crystal molecules.

Furthermore, the domains in the first and second sub-pixel electrodes 171 and 172 can be formed by chevron patterns, e.g. openings or protrusions (not shown in the figures).

The first sub-electrode 171 is electrically connected to the drain electrode DE1 of the first transistor TR1 through the first contact hole C1. The second sub-electrode 172 is electrically connected to the drain electrode DE2 of the second transistor TR2 through the second contact hole C2.

Generally, the storage line STL is overlapped with the first sub-pixel electrode 171 and the second sub-pixel electrode 172 to form a storage capacitor between the sub-pixel electrodes and the storage line.

In another exemplary embodiment, the storage line STL may not be overlapped with the first and second sub-pixel electrodes 171 and 172 so that the storage line STL can prevent a cross-talk between the first sub electrode 171 and the second sub electrode 172.

The spacing part CS1 is formed on the color filter 162 and the transistor layer, especially the first and second transistor TR1 and TR2. The spacing part CS1 can be disposed in an area corresponding to the gate metal pattern or the source metal pattern. The spacing part CS1 maintains the cell gap between the array substrate 100a and the opposite substrate 200.

The spacing part CS1 includes an opaque material which can be organic or inorganic to prevent the first and second transistor TR1 and TR2 from generating a photo current.

FIGS. 6A to 6D are cross-sectional views showing a method of manufacturing a display panel of FIG. 5.

Figure 6A:
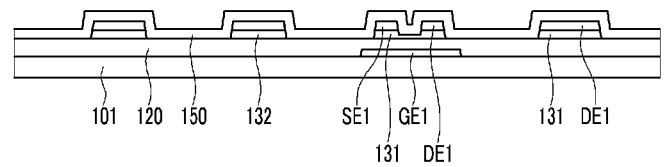
FIGS. 6A to 6D are cross-sectional views showing a method of manufacturing an array substrate of FIG. 5.

A detailed explanation of a process of manufacturing the transistor layer according to another exemplary embodiment of the present invention will be omitted since the process of manufacturing the transistor layer illustrated in FIG. 6A is the same as that of manufacturing the transistor layer illustrated in FIG. 4A.

Figure 6B:
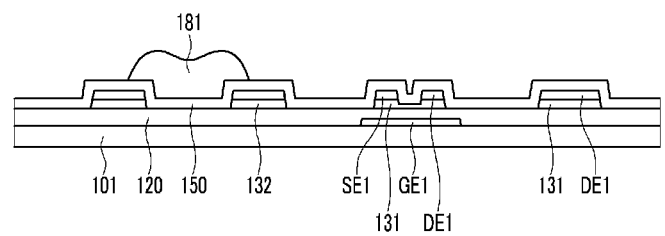

Referring to FIGS. 2, 3, and 6B, a light blocking layer is formed on the display area DA and the peripheral area PA of the base substrate 101 where the transistor layer is formed. The light blocking member 181 is formed on the data lines DLm−1, DLm, DLm+1 and DLm+2 and the gate lines GLn by patterning the light blocking layer.

Meanwhile, in some embodiments of the invention, the light blocking member 181 is not formed on the first and second transistors TR1 and TR2 to allow for inspection of the channel between the source electrodes and the drain electrodes. In other embodiments of the invention the light blocking member 181 may cover a portion of a transistor or the entire transistor.

Figure 6C:
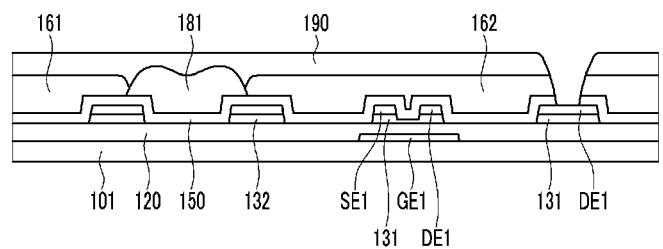

Referring to FIGS. 2, 3, and 6C, the first color filter 161 and the second color filter 162 are sequentially formed on the base substrate 101 where the transistor layer and the light blocking member 181 are formed.

The first and second color filters 161 and 162 may be formed within the light blocking member 181, especially in the pixel areas. The first and second color filters 161 and 162 can be formed by an inkjet method which drops a color filter material into the light blocking member 181. In some embodiments of the invention the color filters 161 and 162 are thinner than the light blocking member 181 to prevent the color filters 161 and 162 from mingling with each other.

The second passivation layer 190 may be formed on the color filters 161 and 162, the light blocking member 181.

In some embodiments of the invention the second passivation layer 190 has an even surface so as to prevent light leakage in a boundary area between the color filters 161, 162 and light blocking member 181.

The first and second color filters 161 and 162, the first passivation layer 150 and the second passivation layer 190 may be simultaneously patterned to expose the first and second drain electrodes DE1 and DE2 corresponding to the first and second contact holes C1 and C2 respectively and therefore form the opening area.

Figure 6D:
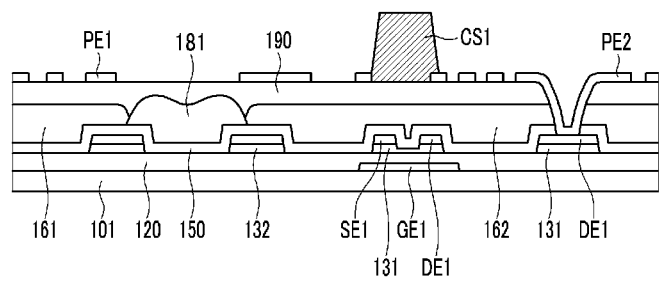

Referring to FIGS. 2, 3 and 6D, a transparent conductive layer is formed on the color filters 161 and 162, the light blocking member 181, the second passivation layer 190 and the first and second contact holes C1 and C2. The transparent conductive layer is patterned so that the pixel electrodes PE1 and PE2 are formed in the pixel areas P1 and P2 of the display area DA respectively. The first and second sub-pixel electrodes 171 and 172 of the pixel electrodes PE1 and PE2 are connected to the drain electrodes DE1 and DE2 in the opening area respectively.

Meanwhile, after the transparent conductive layer is patterned, a process of inspecting and repairing the defect of the first and second transistors TR1 and TR2 is accomplished by applying a voltage to the array substrate.

An opaque layer is formed on the base substrate 101 where the color filters 161 and 162, the light blocking member 181 and the pixel electrodes DE1 and DE2 are located. The spacing part CS1 is formed in an area corresponding to the gate metal pattern or the source metal pattern by patterning the opaque layer. To prevent the transistors from generating photo current, the spacing part CS1 is disposed on the first and second transistor TR1 and TR2. The spacing part CS1 includes an opaque material which can be organic or inorganic.

According to the exemplary embodiments of the present invention, under BOA technology, a process of inspecting and repairing the defect of the transistors can be accomplished with applying a voltage to the array substrate in the course of manufacturing the array substrate.

Although the illustrative embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A display panel comprising:
   a first substrate;
   a second substrate including a display area and a peripheral area surrounding the display area;
   a transistor layer located in the display area of the substrate, the transistor layer comprising at least one transistor connected to a gate line and a data line;
   at least one color filter located in a pixel region on the transistor layer;
   a light blocking member disposed between the color filters;
   at least one pixel electrode located on the color filter;
   an opaque spacing part located on the color filter and overlapping the transistor so as to maintain a cell gap between the first and second substrates,
   wherein the pixel electrode comprises a first sub-pixel electrode and a second sub-pixel electrode separated from each other,
   wherein at least one of the first sub-pixel and the second sub-pixel has micro slits of which the width is below 2.5 times of the cell gap.

2. The display panel of claim 1, wherein the color filter is thinner than the light blocking member.

3. The display panel of claim 1, further comprising a passivation layer located on the color filter and the light blocking layer.

4. The display panel of claim 3, wherein the passivation layer is an organic material or inorganic material.

5. The display panel of claim 1, wherein the light blocking member is not formed on the transistor.

6. A method of manufacturing an array substrate, the method comprising:
   forming a substrate including a display area and a peripheral area surrounding the display area;
   forming a transistor layer in the display area of the substrate, the transistor layer including at least one transistor connected to a gate line and a data line and a circuit layer including a metal pattern in the peripheral area;
   forming at least one color filter on the transistor layer;
   forming a light blocking member disposed between the color filters;
   forming at least one of pixel electrode on the color filter; and
   forming an opaque spacing part on the color filter and overlapping the transistor so as to maintain a cell gap,
   wherein the pixel electrode comprises a first sub-pixel electrode and a second sub-pixel electrode separated from each other,
   wherein at least one of the first sub-pixel and the second sub-pixel has at least first and second domains which have micro slits, and
   wherein the micro slits of the first domain extend in a different direction from the micro slits of the second domain.

7. The method of claim 6, wherein the color filter is formed by an inkjet method after the light blocking member is formed, and the color filter is thinner than the light blocking member.

8. The method of claim 6, further comprising forming a passivation layer on the color filter and the light blocking layer.

9. The method of claim 6, wherein the light blocking member is not formed on the transistor.

10. The method of claim 9, further comprising inspecting and repairing the defect of the transistors.

11. The display panel of claim 1, wherein the light blocking member does not overlap the transistor.

12. The method of claim 6, wherein a light blocking member is formed not overlapping the transistor.

13. The display panel of claim 1, wherein the light blocking member extends farther away from the first substrate than the color filter.

14. The method of claim 6, wherein a light blocking member is formed to extend farther away from the substrate than the color filter.

15. A display panel comprising:
    a first substrate;
    a second substrate including a display area and a peripheral area surrounding the display area;
    a transistor layer located in the display area of the substrate, the transistor layer comprising at least one transistor connected to a gate line and a data line;
    at least one color filter located in a pixel region on the transistor layer;
    a light blocking member disposed between side surfaces defining the color filters and overlapping top surfaces defining the color filters;
    at least one pixel electrode located on the color filter;
    an opaque spacing part located on the color filter corresponding to the transistor so as to maintain a cell gap between the first and second substrates,
    wherein the light blocking member does not overlap the transistor, and
    wherein the opaque spacing part is a single uniform opaque layer.

16. The display panel of claim 15, wherein the color filter is thinner than the light blocking member.

17. The display panel of claim 15, wherein the pixel electrode comprises a first sub-pixel electrode and a second sub-pixel electrode separated from each other.

18. The display panel of claim 15, wherein the pixel electrode overlaps at least a portion of the transistor.

19. A display panel comprising:
    a first substrate;
    a plurality of gate lines disposed on the first substrate;
    a plurality of data lines disposed on the first substrate and intersecting the gate lines;
    a plurality of color filters disposed on the first substrate;
    a light blocking member disposed between side surfaces of the color filters; and
    a spacing part located on the color filters,
    wherein the light blocking member overlaps top surfaces of two color filters of the plurality of color filters and two data lines of the plurality of data lines disposed on both sides of the light blocking member, and
    wherein the spacing part is a single uniform opaque layer.

20. The display panel of claim 19, wherein the spacing part is opaque.

21. The display panel of claim 20, further comprising a transistor connected to the gate lines and the data lines, wherein the spacing part is located to overlap the transistor.

22. The display panel of claim 15, wherein the at least one pixel electrode is located over the color filter and the light blocking member.

* * * * *